(12) United States Patent
Lee et al.

(10) Patent No.: US 7,215,033 B2
(45) Date of Patent: May 8, 2007

(54) WAFER LEVEL STACK STRUCTURE FOR SYSTEM-IN-PACKAGE AND METHOD THEREOF

(75) Inventors: Kang-Wook Lee, Suwon-si (KR); Se-Yong Oh, Yongin-si (KR); Young-Hee Song, Yongin-si (KR); Gu-Sung Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/899,175

(22) Filed: Jul. 27, 2004

(65) Prior Publication Data

US 2005/0104181 A1    May 19, 2005

(30) Foreign Application Priority Data

Nov. 19, 2003    (KR) ...................... 10-2003-0082227

(51) Int. Cl.
　　*H01L 23/48*　　(2006.01)
　　*H01L 23/52*　　(2006.01)
　　*H01L 29/40*　　(2006.01)
　　*H01L 23/02*　　(2006.01)

(52) U.S. Cl. ...................... 257/777; 257/686; 257/774; 257/737; 257/E23.145

(58) Field of Classification Search ................ 257/686, 257/777, 737, 738, 780, 774
See application file for complete search history.

(56) References Cited

U.S. PATENT DOCUMENTS

| | | | |
|---|---|---|---|
| 6,239,495 B1 * | 5/2001 | Sakui et al. ................. | 257/777 |
| 6,577,013 B1 * | 6/2003 | Glenn et al. ................. | 257/777 |
| 6,611,052 B2 * | 8/2003 | Poo et al. .................... | 257/686 |
| 6,809,421 B1 * | 10/2004 | Hayasaka et al. ........... | 257/777 |
| 2004/0080040 A1 * | 4/2004 | Dotta et al. ................. | 257/698 |
| 2004/0188819 A1 * | 9/2004 | Farnworth et al. .......... | 257/686 |
| 2005/0242422 A1 * | 11/2005 | Klein et al. ................. | 257/686 |

FOREIGN PATENT DOCUMENTS

| | | |
|---|---|---|
| JP | 10223833 | 8/1998 |
| JP | 2002100727 | 4/2002 |
| JP | 2002-217356 | 8/2002 |
| KR | 2002-0024624 | 4/2002 |

OTHER PUBLICATIONS

Korean Office Action Issued Nov. 18, 2005.

* cited by examiner

*Primary Examiner*—Nitin Parekh
(74) *Attorney, Agent, or Firm*—Harness, Dickey & Pierce, P.L.C.

(57) ABSTRACT

A wafer level stack structure, including a first wafer including at least one first device chip of a first chip size, wherein each first device chip contains a first plurality of input/output (I/O) pads, a second wafer including at least one second device chip of a second chip size smaller than the first chip size, wherein each second device chip contains a second plurality of I/O pads, wherein the at least one second device chip is increased to the first chip size, wherein the first wafer and the second wafer are stacked, and wherein the first wafer and the second wafer are coupled to each other. A method of forming a wafer level stack structure, including forming a first wafer including at least one first device chip of a first chip size, wherein each first device chip contains a first plurality of input/output (I/O) pads, forming a second wafer including at least one second device chip of a second chip size smaller than the first chip size, wherein each second device chip contains a second plurality of I/O pads, wherein the at least one second device chip is increased to the first chip size, stacking the first wafer and the second wafer, and coupling the first wafer and the second wafer to each other. A system-in-package, including a wafer level stack structure including at least one first device chip with a first plurality of input/output (I/O) pads and at least one second device chip with a second plurality of I/O pads, and a common circuit board to which the wafer level stack structure is connected.

11 Claims, 9 Drawing Sheets

WAFER LEVEL STACK STRUCTURE FOR SYSTEM-IN-PACKAGE AND METHOD THEREOF

CROSS REFERENCE TO RELATED APPLICATIONS

This U.S. non-provisional application claims the benefit of priority under 35 U.S.C. §119 to Korean Patent Application No. 2003-82227 filed Nov. 19, 2003, the contents of which are incorporated herein in its entirety by reference.

BACKGROUND OF THE INVENTION

1. Field of the Invention

The present invention relates to electronic packaging technology and more generally, to a wafer level stack structure in a system-in-package and method thereof.

2. Description of the Related Art

An electronic package, which may be referred to as a semiconductor package, may be defined as the housing and interconnection of integrated circuits, which may be referred to as the chip or the die, which may form an electronic system. The electronic package may include a structure to physically support the chip, a physical housing to protect the chip from the environment, a means of heat dissipation, and electrical connections to allow signal and power access to and from the chip. Packaging technology may be a factor in the determination of the price, performance, and reliability of a final semiconductor product.

Three-dimensional stack technology is a method of creating semiconductor packages currently used in the art. A chip stack that utilizes three-dimensional stack technology may be fabricated at the chip level by conventional methods. However, a wafer level fabrication technique has been recently developed to achieve simpler, more cost-effective chip stack packages.

The Wafer-Level Chip-Scale Package (WLCSP) is a type of packaging which enables the integrated circuit (IC) to be attached to a circuit board face-down, with the chip's pads connecting to the circuit board's pads through individual solder balls without needing any underfill material. This technology differs from other packaging technologies because there are no bond wires or interposer connections. An advantage of the WLCSP is a reduction of inductance in the electronic device being packaged. Other benefits of the WLCSP may include a reduction in package size, manufacturing cycle time and enhanced thermal conduction characteristics.

System-in-package (SIP) is a technology which may allow integrated single packaging of different kinds of electronic devices. SIP may offer increases in the performance and function of semiconductor devices while decreasing their size and/or cost.

FIG. 1 illustrates a cross-sectional view of a SIP using a chip level stack technique according to conventional methods. Referring to FIG. 1, the SIP 10 may include electronic devices of different sizes illustrated by elements 12, 13 and 14. The elements 12, 13 and 14 are stacked on a common circuit board 11, attached with an adhesive 15, and electrically coupled to the common circuit board 11 with bonding wires 16. An encapsulant 17, such as an epoxy resin, is provided on an upper surface of the board 11 to protect the devices 12, 13, 14 and the wires 16. A plurality of solder balls 18 may be included on a lower surface of the common circuit board 11.

FIG. 2 illustrates a plan view of device chips of the SIP of FIG. 1 according to conventional methods. The device chips 12, 13 and 14 are not typically aligned with each other. Specifically, the number of input/output (I/O) pads 12a, 13a and 14a, etc., may differ from device chip to device chip.

The conventional SIP 10 is currently limited to application at the chip level only. Thus, there is currently no method of applying WLCSP to a SIP.

SUMMARY OF THE INVENTION

An exemplary embodiment of the present invention is a wafer level stack structure comprising a first wafer including at least one first device chip, wherein each first device chip contains a first plurality of input/output (I/O) pads, a second wafer including at least one second device chip, wherein each second device chip contains a second plurality of I/O pads, wherein the first wafer and the second wafer are stacked and wherein the first wafer and the second wafer are coupled to each other.

Another exemplary embodiment of the present invention is a method of forming a wafer level stack structure comprising forming a first wafer including at least one first device chip, wherein each first device chip contains a first plurality of input/output (I/O) pads, forming a second wafer including at least one second device chip, wherein each second device chip contains a second plurality of I/O pads, stacking the first wafer and the second wafer, and coupling the first wafer and the second wafer to each other.

Another exemplary embodiment of the present invention is a system-in-package, comprising a wafer level stack structure including at least one first device chip with a first plurality of input/output (I/O) pads and at least one second device chip with a second plurality of I/O pads, and a common circuit board to which the wafer level stack structure is connected.

Another exemplary embodiment of the present invention is a method of forming a system-in-package for containing a wafer level stack structure, comprising forming a wafer level stack structure including at least one first device chip having a first plurality of input/output (I/O) pads and at least one second device chip having a second plurality of I/O pads, and forming a common circuit board to which the wafer level stack structure is connected.

BRIEF DESCRIPTION OF THE DRAWINGS

The present invention will become more apparent by describing in detail exemplary embodiments thereof with reference to the attached drawings in which.

DETAILED DESCRIPTION OF EXEMPLARY EMBODIMENTS OF THE INVENTION

Figure 1:
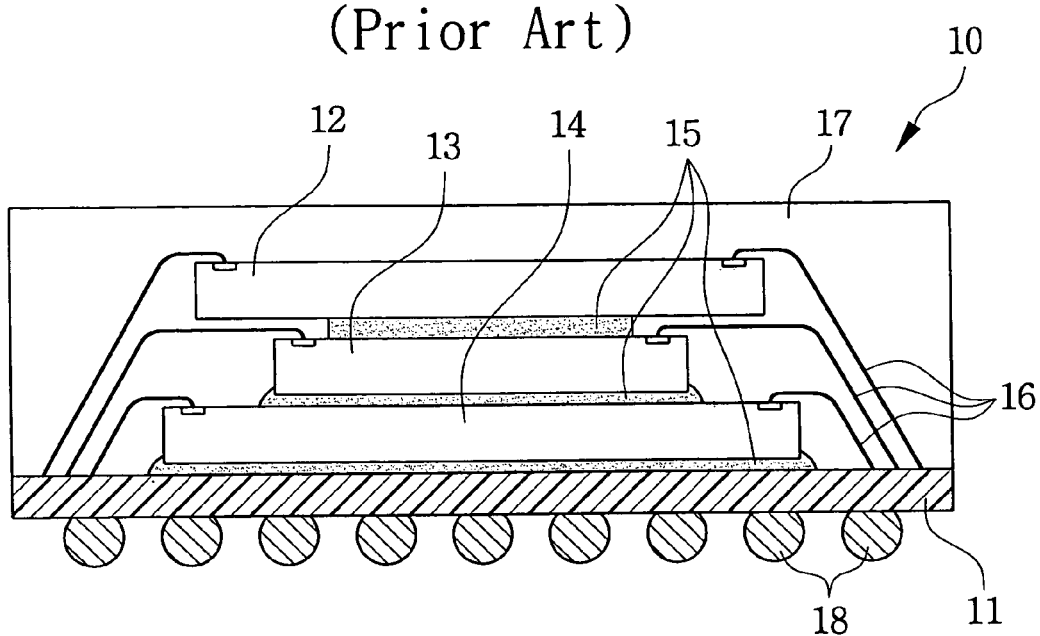
FIG. 1 illustrates a cross-sectional view of a system-in-package (SIP) using a chip level stack technique according to conventional methods.

Hereinafter, exemplary embodiments of the present invention will be described in detail with reference to the accompanying drawings.

In the Figures, the same reference numerals are used to denote corresponding elements throughout the Figures. It will be further appreciated that the figures are not drawn to scale. Rather, for simplicity and clarity of illustration, the dimensions of some of the elements are exaggerated relative to other elements.

In the description, well-known structures and processes have not been described or illustrated in detail to avoid obscuring the present invention. Further, the term "device-type" employed herein refers to one of a plurality of device types. For example, device types may include memory devices such as DRAM, SRAM, flash memory, or non-memory devices such as the CPU, ASIC, and other devices.

Chip Layout

Figure 3:
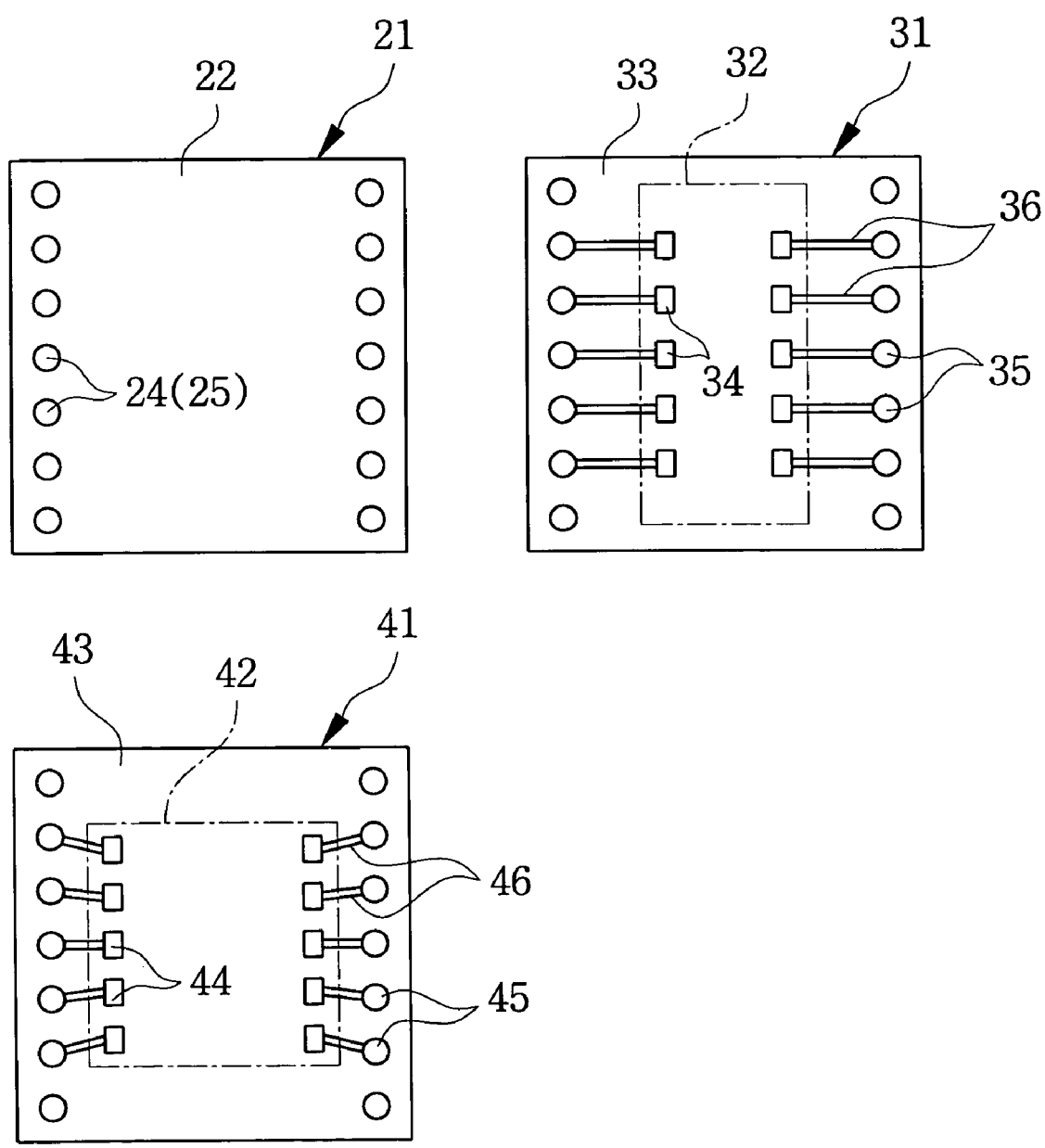
FIG. 3 illustrates a plan view of device chips of different device types according to an exemplary embodiment of the present invention.

FIG. 3 illustrates a plan view of device chips of different device types according to an exemplary embodiment of the present invention.

Figure 2:
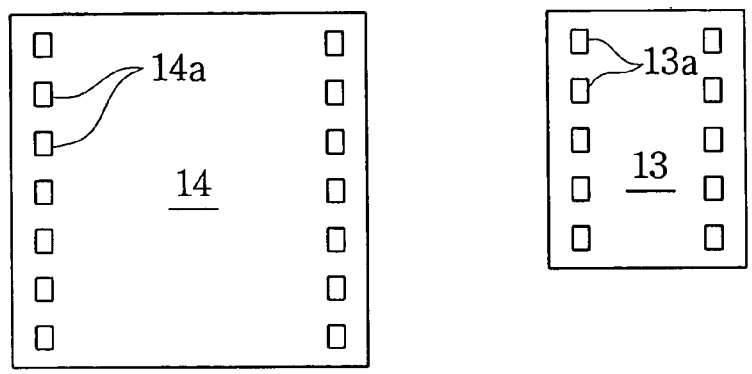
FIG. 2 illustrates a plan view of device chips of the SIP of FIG. 1 according to conventional methods.
Figure 2:
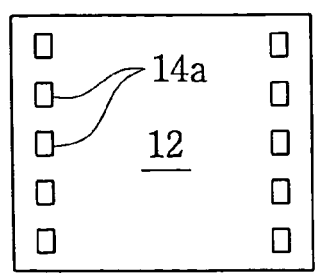

As shown in FIG. 3, the device chips 21, 31 and 41 may be formed with a first chip size, irrespective of the device types of device chips 21, 31 and 41, respectively. Further, the first chip size of the device chips 21, 31 and 41 are substantially equal to or slightly larger than the chip size of the device 14 of FIGS. 1–2, where the device 14 is the largest of devices 12–14. The device 14 may have a chip size equivalent to the first chip size, the device 13 may have a second chip size, and the device 12 may have a third chip size.

As shown, the first chip size of the first device chip 21 is substantially equal to the first chip size of the device chip 14, and therefore device chip 14 may require no peripheral region for extending the first chip size of device chip 14. A second device chip 31 may be extended to the first chip size by adding a first peripheral region 33 to a first device region 32, which may have the second chip size being less than the first chip size and may contain device chip 13. Similarly, a third device chip 41 may be extended to the first chip size by adding a second peripheral region 43 to a smaller second device region 42, which may have the third chip size being less than the first chip size and may contain device chip 12.

As discussed above, the device chips 21, 31 and 41 may each be a different device type while being formed to the first chip size. In addition, each of the device chips 21, 31 and 41 may have vias 25, 35 and 45, respectively. The vias 25, 35, and 45 may be formed so that each of the vias 25, 35 and 45 are aligned when the device chips 21, 31 and 41, respectively, are stacked. The vias 25, 35 and 45 are formed near edges of the device chips 21, 31 and 41, respectively. Therefore, the vias 35 of the second device chip 31 and the vias 45 of the third device chip 41 may be formed within the peripheral regions 33 and 43. Each via within vias 25, 35 and 45 may be an interconnection path through device chips 21, 31 and 41, respectively, formed by conductive material that fill a hole which may be vertically bored through the device chips 21, 31 and 41.

The device regions 22, 32 and 42 may be fabricated similar to conventional device chips, and the input/output (I/O) pads 24, 34 and 44 may be formed at the same position as in conventional device chips. The vias 25 of the first device chip 21 may be provided just at the I/O pads 24. However, the vias 35 and 45 of the second device chip 31 and third device chip 41 may be formed at positions different from the I/O pads 34 and 44. Therefore, rerouting lines 36 and 46 may be formed between the vias 35 and 45 and the I/O pads 34 and 44 in order to electrically connect the I/O pads 34 and 44 with the vias 35 and 45, respectively.

The first peripheral region 33 and the second peripheral region 43 may contain no internal circuitry, similar to scribe lanes which will be described later with reference to FIGS. 5A–5G. The first peripheral region 33 and the second peripheral region 43 may be formed as an extension of the scribe lanes. Therefore, no additional function may be required for the peripheral regions 33 and 43 beyond serving to extend device regions 32 and 42 to the first chip size.

Figure 7:
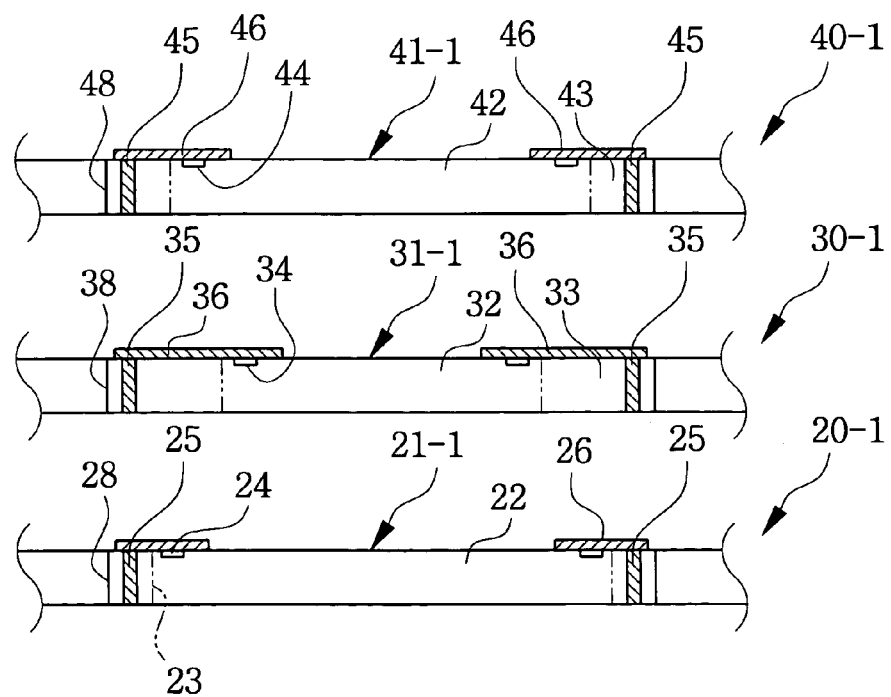
FIG. 7 illustrates a cross-sectional view of a wafer level stack structure comprising device chips of different device types according to another exemplary embodiment of the present invention.

In another exemplary embodiment of the present invention, the first device chip 21 may have a peripheral region similar to the peripheral regions 33 and 43 with respect to the second device chip 31 and third device chip 41 as described above. Such an exemplary embodiment is shown in FIG. 7, which will be described later.

In an exemplary embodiment of the present invention, device chips 21, 31 and 41 may be different device types while being formed to the first chip size, which may enable the device chips 21, 31 and 41 to be stacked. Further, a system-in-package may be formed, including the wafer level stack structure.

Wafer Level Stack Structure Formation

Figure 4:
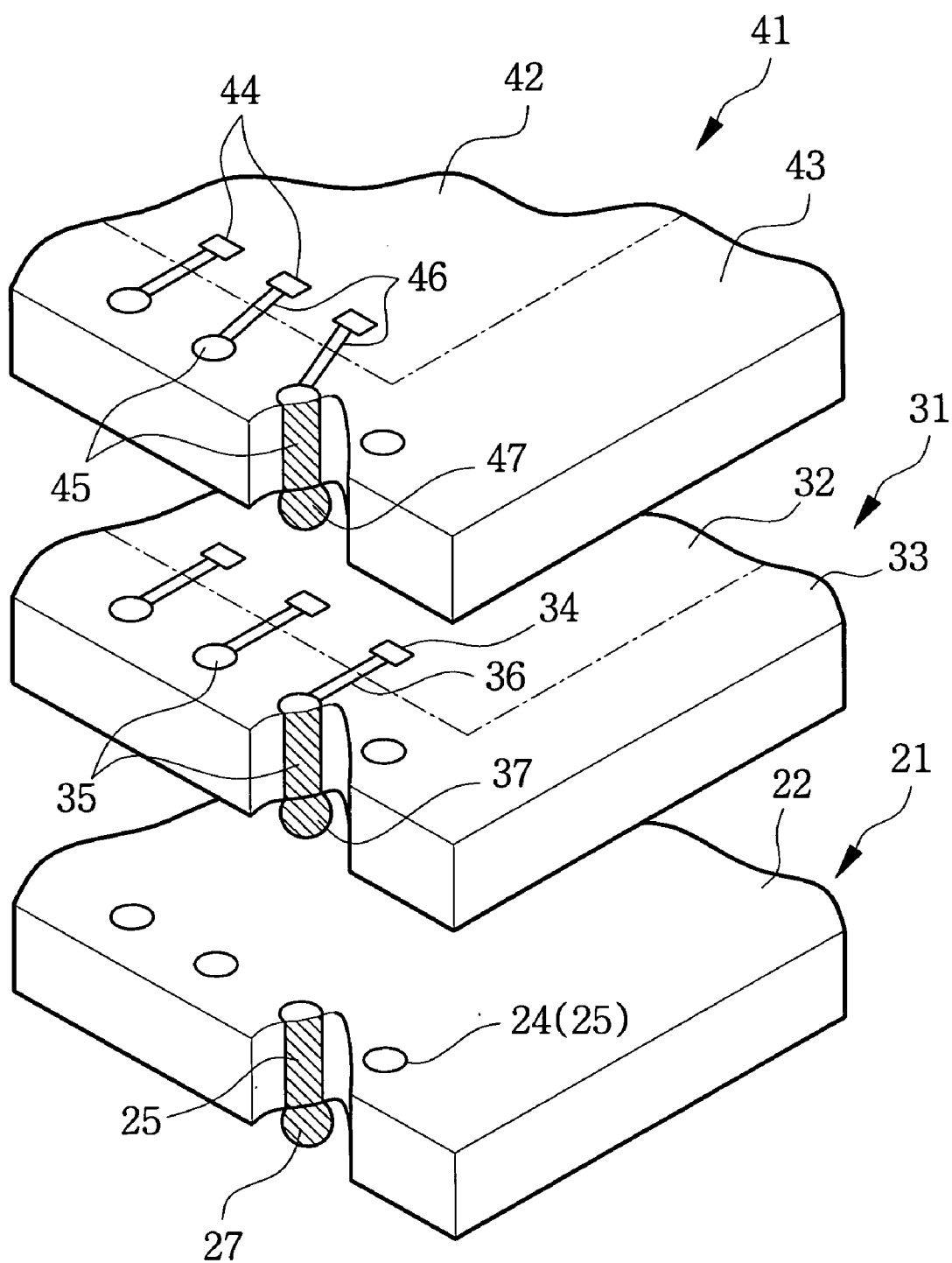
FIG. 4 illustrates a wafer level stack structure comprising device chips of different types according to an exemplary embodiment of the present invention.

FIG. 4 illustrates a wafer level stack structure comprising device chips of different types according to an exemplary embodiment of the present invention. As shown in FIG. 4, the stacked device chips 21, 31 and 41 have the first chip size.

Electrical connections between the stacked device chips 21, 31 and 41 are established by connection bumps 27, 37 and 47, respectively, as well as the vias 25, 35 and 45, respectively. The vias 25, 35 and 45 of the device chips 21, 31 and 41, respectively, may be aligned. The connection bumps 27, 37 and 47 may be formed under the vias 25, 35 and 45, respectively, before the device chips 21, 31 and 41 are stacked. When the device chips 21, 31 and 41 are stacked, the connection bumps of device chips on the stack are attached and joined to the vias of adjacent device chips with a lower relative position on the stack. For example, as shown in FIG. 4, device chip 21 has a lower position on the stack as compared to device chip 31, and further is adjacent to device chip 31. Further, the vias 35 and 45 of the second device chip 31 and third device chip 41, respectively, may be electrically coupled to the I/O pads 34 and 44 through the rerouting lines 36 and 46.

The I/O pads 24, 34 and 44 may each be different in number. The vias 25, 35 and 45, the rerouting lines 36 and 46, and/or the connection bumps 27, 37 and 47 may be used for heat dissipation as well as electrical connections. Further, the vias 25, 35 and 45, the rerouting lines 36 and 46, and/or the connection bumps 27, 37 and 47 may be used for chip selection of the stacked device chips. The vias 25, 35 and 45, the rerouting lines 36 and 46, and/or the connection bumps 27, 37 and 47 may also be used as mechanical supports, without electrical connections, between the adjacent upper and lower device chips.

Structure Including Device Chips of Different Device Types

In an exemplary embodiment of the present invention, the stack structure of the device chips 21, 31, and 41 shown in FIG. 4 may be fabricated at the wafer level.

FIGS. 5A–5F illustrate cross-sectional views of a wafer level stack structure comprising different types of device chips according to an exemplary embodiment of the present invention. FIG. 5G illustrates a resultant wafer level stack structure fabricated from the methods illustrated in FIGS. 5A–5F.

Figure 5A:
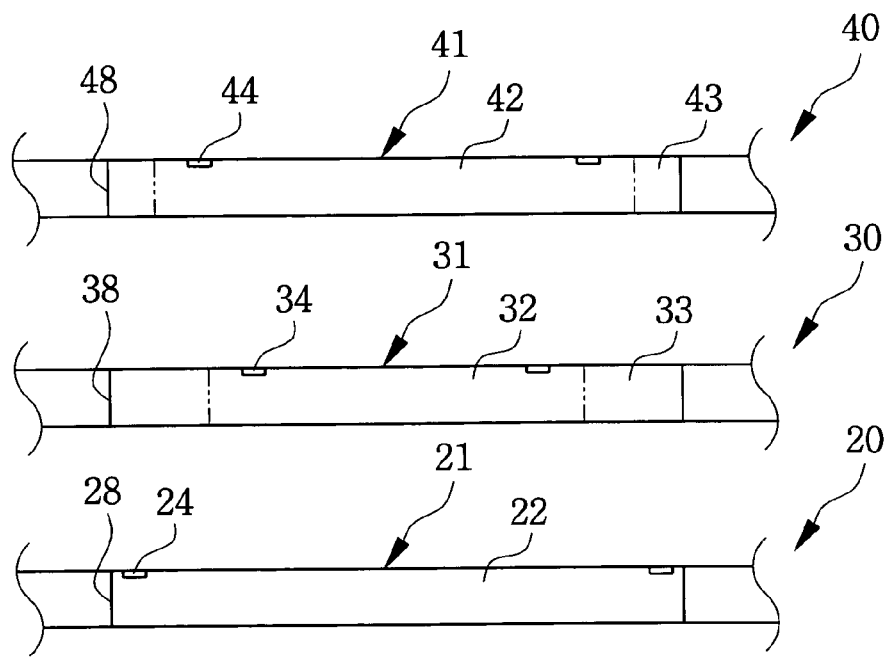
FIGS. 5A–5F illustrate s cross-sectional views of a wafer level stack structure comprising different types of device chips according to an exemplary embodiment of the present invention.

FIG. 5A illustrates wafers 20, 30 and 40. Each one of wafer 20, 30 and 40 may contain a plurality of device chips 21, 31 and 41, respectively, which may be separated by scribe lanes 28, 38 and 48. Although the scribe lanes are illustrated as lines, those skilled in the art will appreciate that the scribe lanes may be formed as narrow regions. Each one of wafer 20, 30 and 40 may be fabricated independently based on the type of device chip contained within each wafer 20, 30 and 40. Wafer fabrication processes are well known in this art, and will not be discussed further.

In an exemplary embodiment of the present invention, the first wafer 20 may contain a plurality of first device chips 21 separated by scribe lanes 28. Each of the plurality of first device chips 21 may be composed of the device region 22 only. The I/O pads 24 may be formed near edges of the device region 22 in this exemplary embodiment of the present invention. However, in another exemplary embodiment of the present invention illustrated in FIG. 7, the first device chip 21-1 may have a peripheral region 23.

In another exemplary embodiment of the present invention, the second wafer 30 may contain a plurality of second device chips 31 separated by scribe lanes 38. Each of the plurality of second device chip 31 may comprise the device region 32 and the peripheral region 33. The device region 32 may correspond to the above-described second device chip 13 illustrated in FIG. 2. The I/O pads 34 may be formed near edges of the device region 32 in this exemplary embodiment of the present invention.

In another exemplary embodiment of the present invention, the third wafer 40 may contain a plurality of third device chips 41 separated by scribe lanes 48. Each of the plurality of third device chips 41 may comprise the device region 42 and the peripheral region 43. The device region 42 may correspond to the above-described third 12 illustrated in FIG. 2. The I/O pads 44 may be formed near edges of the device region 42 in this exemplary embodiment of the present invention.

Figure 5B:
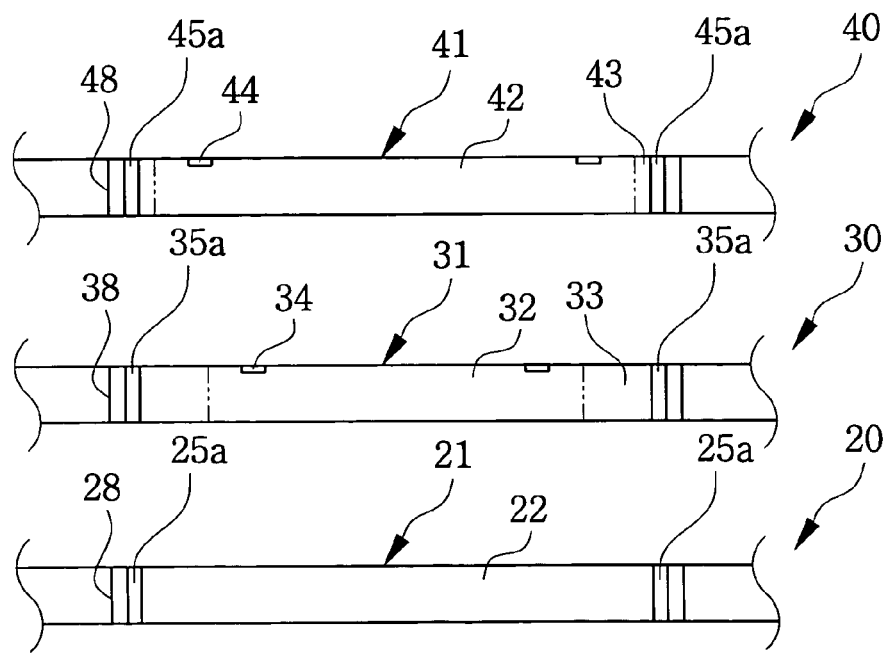

As shown in FIG. 5B, a plurality of via holes 25a, 35a and 45a may be formed near chip edges within the device chips 21, 31 and 41, respectively. The corresponding upper and lower via holes 25a, 35a and 45a may be aligned. Therefore, the via holes 25a of the first device chip 21 may be formed at the I/O pads 24 in FIG. 5A. However, the via holes 35a and 45a of the second device chip 32 and the third device chip 42 may be formed within the peripheral regions 33 and 43, respectively. This may be necessary in order to properly align the device chips when they are stacked. If the first device chip 21-1 contains the peripheral region 23 as illustrated in FIG. 7, the via holes 25a of the first device chip 21-1 may be formed within the peripheral region 23. The via holes 25a, 35a and 45a may be formed by laser drilling and/or any other conventional technique well known in the art.

Figure 5C:
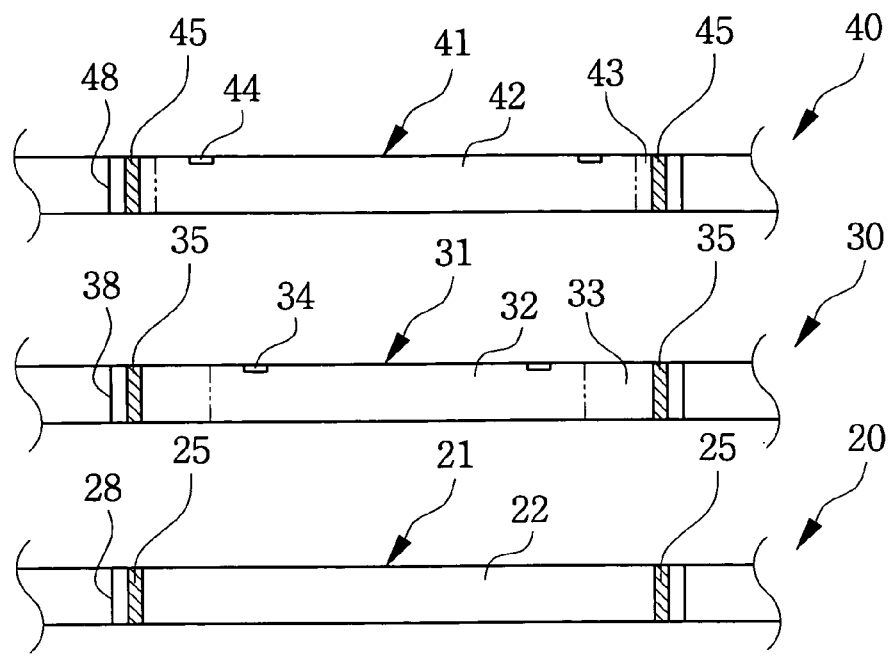

As illustrated in FIG. 5C, the via holes may be filled with a conductive material, thereby forming the vias 25, 35 and 45. The vias 25, 35 and 45 act as electrical paths between the stacked device chips 21, 31 and 41, respectively. Further, the vias 25, 35 and 45 may be used for heat dissipation and/or chip selection.

Figure 5D:
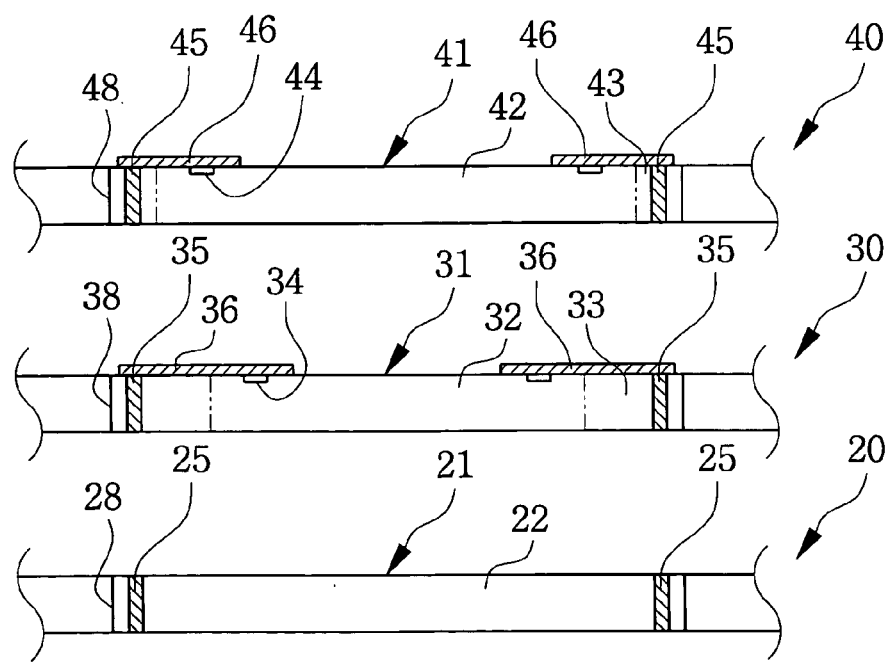

As shown in FIG. 5D, the rerouting lines 36 and 46 may be formed between the vias 35 and 45 and the I/O pads 34 and 44 of the second device chip 31 and third device chip 41, respectively. The rerouting lines 36 and 46 may also be used for heat dissipation and/or chip selection.

Figure 5E:
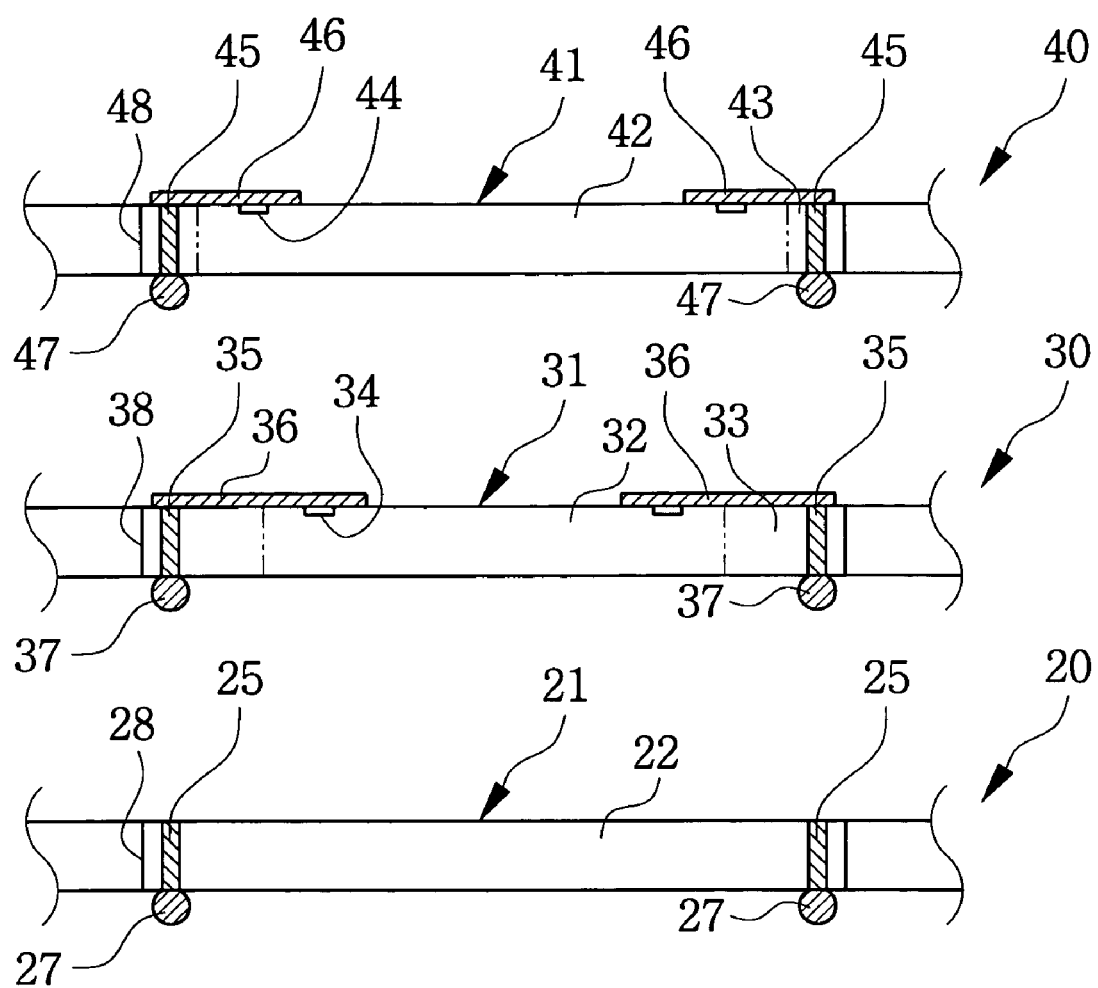

As shown in FIG. 5E, the connection bumps 27, 37 and 47 may be formed under the vias 25, 35 and 15, respectively, providing mechanical and/or electrical connections between the wafers 20, 30 and 40. Some of the connection bumps 27, 37 and 47 may be used solely as mechanical supports, and not as electrical connections. Further, the connection bumps 27, 37 and 47 may be formed above the vias. This exemplary embodiment of the present invention will be discussed in detail below.

Figure 5F:
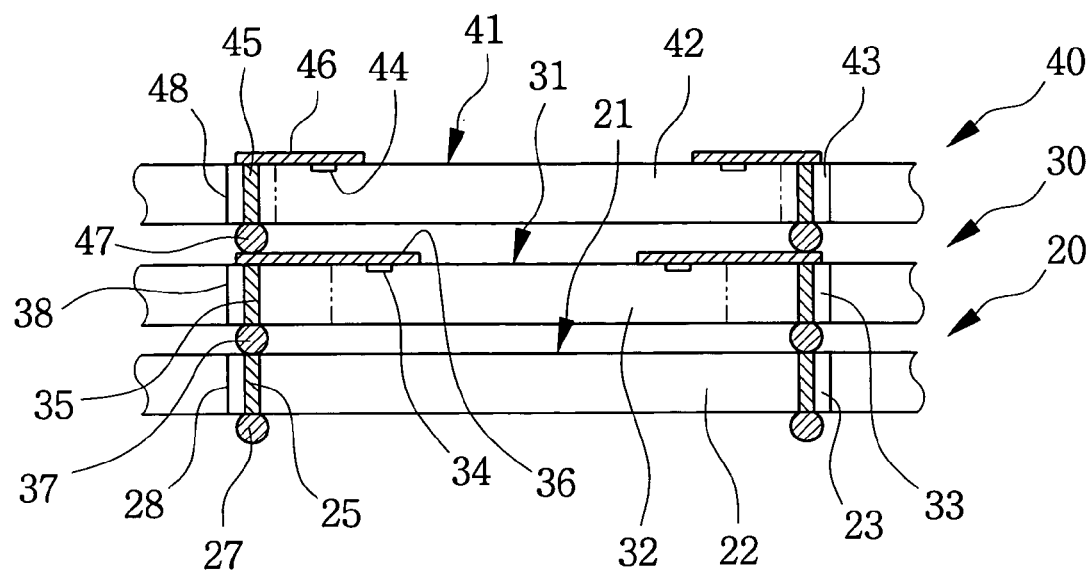
Figure 5G:
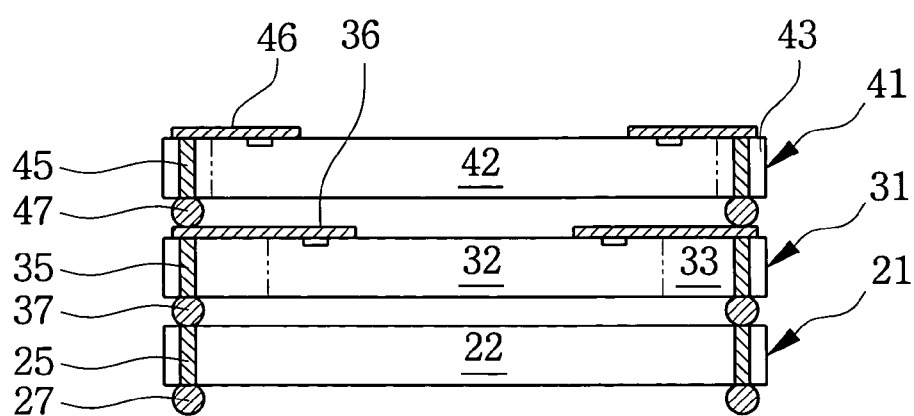
FIG. 5G illustrates a resultant wafer level stack structure fabricated from the methods illustrated in FIGS. 5A–5F.

As shown in FIG. 5F, the wafers 20, 30 and 40 may be stacked. When the wafers 20, 30 and 40 are stacked, the connection bumps 37 and 47 of the relatively upper wafer 30 may be attached and joined to the vias 25 of the relatively lower wafer 20, and the relatively upper wafer 40 may be attached and joined to the vias 35 of the relatively lower wafer 30.

In an exemplary embodiment of the present invention, the stacked wafers 20, 30 and 40 may be simultaneously sawed along the scribe lanes 28, 38 and 48, thereby forming a plurality of stacks of the device chips of different device types. Accordingly, the above described method of forming a wafer level stack structure may provide an improvement in productivity and a reduction in production cost in comparison with the conventional chip level stack method.

System-in-Package Including Wafer Level Stack Structure

Figure 6:
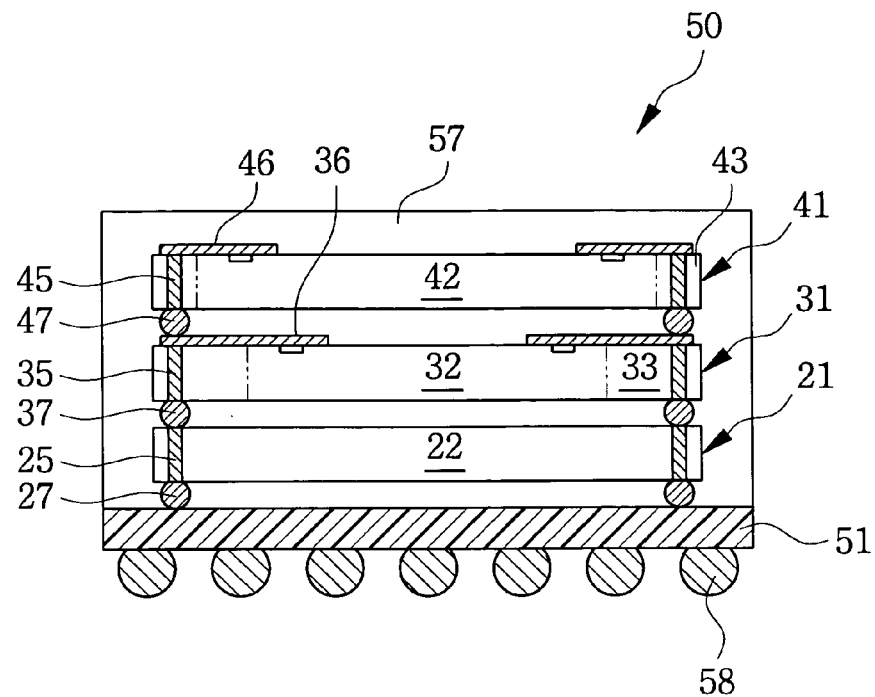
FIG. 6 illustrates a cross-sectional view of a system-in-package (SIP) 50 including a wafer level stack structure according to an exemplary embodiment of the present invention.

FIG. 6 illustrates a cross-sectional view of a system-in-package (SIP) 50 including a wafer level stack structure according to an exemplary embodiment of the present invention.

Referring to FIG. 6, a wafer level stack structure comprising the device chips 21, 31 and 41 may be formed on a common circuit board 51. The common circuit board 51 may be a printed circuit board (PCB) or any other structure well known in this art. The wafer level stack structure may be directly connected to the board common circuit 51 through the connection bumps 27 of the first device chip 21. Electrical interconnections between the respective device chips 21, 31 and 41 and between the wafer level stack structure and the common circuit board 51 may be made through the vias 25, 35 and 45, the rerouting lines 26, 36 and 46, and/or the connection bumps 27, 37 and 47, respectively. Therefore, the SIP 50 of FIG. 6 may have shorter interconnection paths than the conventional SIP 10 in FIG. 1.

An encapsulant 57, such as an epoxy resin, may be formed on an upper surface of the common circuit board 51 to protect the wafer level stack structure from the external conditions, and solder balls 58 may be formed on a lower surface of the common circuit board 51 in order to form external connections to a next-level common circuit board (not shown).

Example of Wafer Level Stack Structure

FIG. 7 illustrates a cross-sectional view of a wafer level stack structure comprising device chips of different device types according to another exemplary embodiment of the present invention. FIG. 7 may correspond to FIG. 5D which illustrates intermediate products of the wafer level stack structure during fabrication.

Referring to FIG. 7, the wafer level stack structure may comprise three kinds of wafers represented by wafers 20-1, 30-1 and 40-1. Each first device chip 21-1, may be contained in the first wafer 20-1, and may have a peripheral region 23, similar to the peripheral regions 33 and 44 of the second device chip 31-1 and third device chip 41-1, respectively. The first device chip 21-1 may also contain rerouting lines 26, similar to rerouting lines 36 and 46, that connect the I/O pads 24 with the vias 25.

Another Example of Wafer Level Stack Structure

Figure 8:
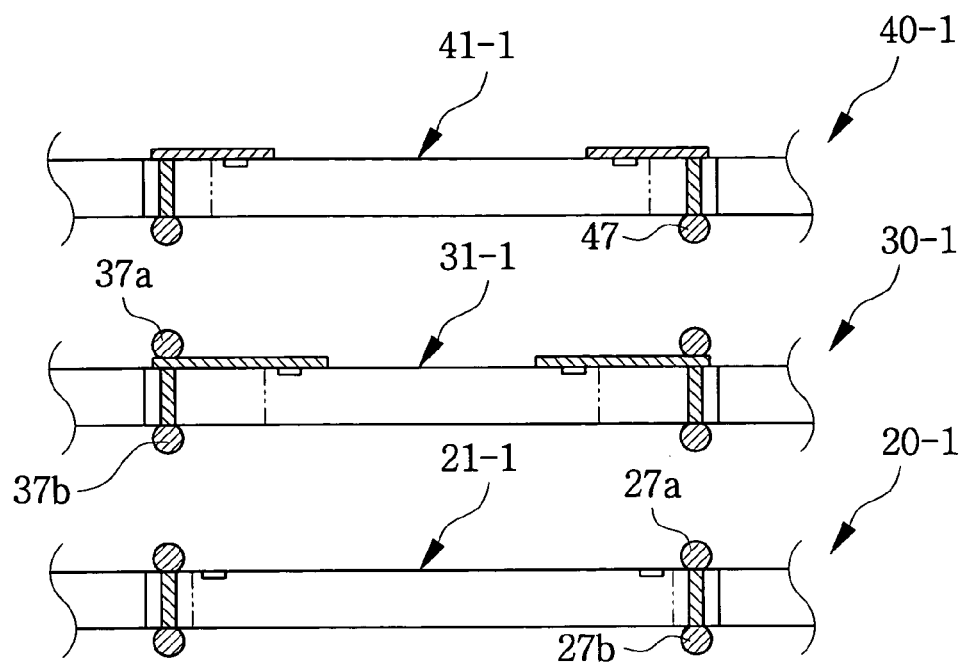
FIG. 8 illustrates a cross-sectional view of a wafer level stack structure comprising device chips of different device types according to another exemplary embodiment of the present invention.

FIG. 8 illustrates a cross-sectional view of a wafer level stack structure comprising device chips of different device types according to another exemplary embodiment of the present invention. FIG. 8 may correspond to FIG. 5F which illustrates intermediate products of the wafer level stack structure during fabrication.

Referring to FIG. 8, the wafer level stack structure of wafers 20-2, 30-2 and 40-2 may be characterized by upper and lower connection bumps 27a, 27b, 37a and 37b of the first device chip 21 and the second device chip 31, respectively. When the wafers are stacked, the upper connection bumps 27a on the first wafer 20-2 may be joined to the lower connection bumps 37b under the second wafer 30-2, and the upper connection bumps 37a on the second wafer 30-2 are joined to the connection bumps 47 under the third wafer 40-2.

Another Example of System-in-Package

Figure 9:
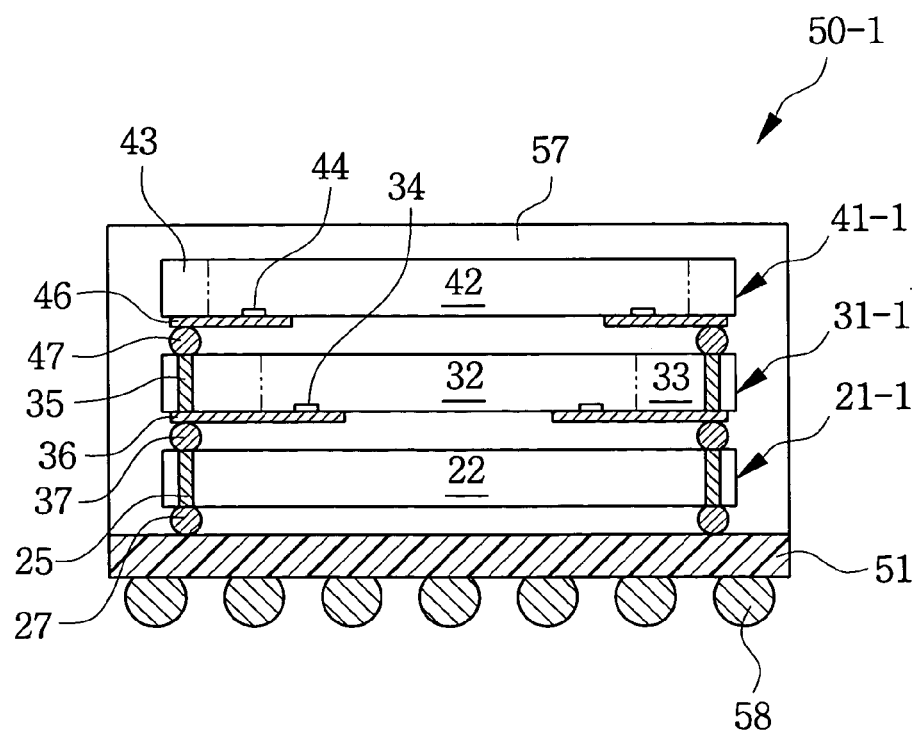
FIG. 9 illustrates a cross-sectional view of a system-in-package (SIP) including a wafer level stack structure according to another exemplary embodiment of the present invention.

FIG. 9 illustrates a cross-sectional view of a system-in-package (SIP) including a wafer level stack structure according to another exemplary embodiment of the present invention.

Referring to FIG. 9, within the SIP 50-1, device chips 21-2, 31-2 and 41-2 may be mounted to the common circuit board 51 in a flip-chip fashion so that the I/O pads 24, 34 and 44 may face toward the common circuit board 51. During the fabrication of the wafer level stack structure, the connection bumps 27, 37 and 47 may be formed above the device chips 21-2, 31-2 and 41-2, respectively, and not underneath the device chips 21-2, 31-2 and 41-2. The wafer level stack structure may then be flipped over and connected to the common circuit board 51. In such a wafer level stack structure, the third device chip 41-2 may have no vias.

The exemplary embodiments of the present invention being thus described, it will be obvious that the same may be varied in many ways. For example, while above exemplary embodiments describe a wafer level stack structure comprising three wafers, the number of stacked wafers may be greater or less than three and still remain within the scope of the present invention.

Such variations are not to be regarded as a departure from the spirit and scope of the exemplary embodiments of the present invention, and all such modifications as would be obvious to one skilled in the art are intended to be included within the scope of the following claims.

What is claimed is:

1. A wafer level stack structure, comprising:
  a first wafer including at least one first device chip, wherein each first device chip includes a first device region, a first peripheral region surrounding the first device region, and a first plurality of input/output (I/O) pads formed in the first device region;
  a second wafer including at least one second device chip approximately equal in size to the first device chip, wherein each second device chip includes a second device region having a larger size than the first device region, a second peripheral region surrounding the second device region, and a second plurality of I/O pads formed in the second device region,
  wherein the first wafer and the second wafer are stacked; and
  wherein the first wafer and the second wafer are coupled to each other.

2. The wafer level stack structure of claim 1, wherein the size of the first device region of the at least one first device chip is larger in size than device regions of each device chip of each wafer in the wafer level stack structure.

3. The wafer level stack structure of claim 1 wherein each second peripheral region is larger than its corresponding second device chip region.

4. The wafer level stack structure of claim 1, wherein:
  each of the first and second device chips include a plurality of vias; and
  wherein the plurality of vias are aligned.

5. The wafer level stack structure of claim 4, wherein the plurality of vias are formed near edges of each of the first and second device chips.

6. The wafer level stack structure of claim 4, wherein the plurality of vias of each first device chip are formed only at the first plurality of I/O pads, and wherein the plurality of vias of each second device chip are formed only at the second plurality of I/O pads.

7. The wafer level stack structure of claim 4, wherein each of the first and second device chips contain a plurality of connection bumps.

8. The wafer level stack structure of claim 7, wherein each of the plurality of connection bumps is formed under one of the plurality of vias.

9. A system-in-package including the wafer level stack structure of claim 1.

10. A system-in-package, comprising:
  a wafer level stack structure including
    at least one first device chip including a first device region, a first peripheral region surrounding the first device region, and a first plurality of input/output (I/O) pads formed in the first device region; and
    at least one second device chip including a second device region having a larger size than the first device region, a second peripheral region surrounding the second device region, and a second plurality of I/O pads formed in the second device region,
    wherein the at least one first device chip and the at least one second device chip have approximately equal sizes; and
  a common circuit board to which the wafer level stack structure is connected.

11. The system-in-package of claim 10, wherein each of the first and second device chips are stacked.

* * * * *